(12) United States Patent
Nishimori (10) Patent No.: US 11,215,445 B2
(45) Date of Patent: Jan. 4, 2022

(54) OPTICAL APPARATUS AND DISTANCE MEASURING SYSTEM

(71) Applicant: Ricoh Company, Ltd., Tokyo (JP)

(72) Inventor: Takehiro Nishimori, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 88 days.

(21) Appl. No.: 16/798,545

(22) Filed: Feb. 24, 2020

(65) Prior Publication Data
US 2020/0300610 A1    Sep. 24, 2020

(30) Foreign Application Priority Data
Mar. 19, 2019   (JP) .............................. JP2019-052021

(51) Int. Cl.
| | | |
|---|---|---|
| G01B 11/14 | (2006.01) | |
| G02B 5/30 | (2006.01) | |
| G01B 11/22 | (2006.01) | |
| G01S 7/499 | (2006.01) | |
| G01S 7/481 | (2006.01) | |
| G01S 17/894 | (2020.01) | |

(Continued)

(52) U.S. Cl.
CPC .............. *G01B 11/14* (2013.01); *G01B 11/22* (2013.01); *G01S 7/4812* (2013.01); *G01S 7/499* (2013.01);
(Continued)

(58) Field of Classification Search
CPC ....... G01B 11/026; G01B 11/14; G01B 11/22; G01B 11/24; G01B 11/2408;
(Continued)

(56) References Cited

U.S. PATENT DOCUMENTS 3,815,994 A  *  6/1974  Peckham ................ G01S 17/08
                                                         356/4.06
4,559,445 A  *  12/1985  Hedin .................... G01S 7/4812
                                                         250/203.1

(Continued)

FOREIGN PATENT DOCUMENTS

JP  2013-195302    9/2013
JP  2016-219258    12/2016

(Continued)

OTHER PUBLICATIONS

Machine translation of description of WO 2014162991 A1, 16 pages. (Year: 2014).*

*Primary Examiner* — Gordon J Stock, Jr.
(74) *Attorney, Agent, or Firm* — Xsensus LLP (57) ABSTRACT

An optical apparatus includes: a light source to emit reference light; a phototransmitter optical system to project the reference light emitted from the light source onto a measurement area extending 90 degrees or more; an image sensor having an imaging surface on which an optical image is formed; and a photoreceiver optical system to form an image of reflected light on the imaging surface, the reflected light being resulting from the reference light reflected at a measurement target present in the measurement area extending 90 degrees or more. The phototransmitter optical system and the photoreceiver optical system are disposed such that at least an optical axis of the phototransmitter optical system and an optical axis of the photoreceiver optical system partially coincide with each other, and at least a portion of the phototransmitter optical system and a portion of the photoreceiver optical system constitute a common optical system unit.

10 Claims, 10 Drawing Sheets

(51) Int. Cl.
*G03B 21/20* (2006.01)
*H01S 5/18* (2021.01)

(52) U.S. Cl.
CPC .......... *G01S 17/894* (2020.01); *G02B 5/3025* (2013.01); *G03B 21/204* (2013.01); *H01S 5/18* (2013.01)

(58) Field of Classification Search
CPC . G01B 11/2416; G01B 11/25; G01B 11/2518; G01S 7/481; G01S 7/4811; G01S 7/4812; G01S 7/499; G01S 17/00; G01S 17/02; G01S 17/04; G01S 17/06; G01S 17/08; G01S 17/10; G01S 17/14; G01S 17/18; G01S 17/26; G01S 17/32; G01S 17/34; G01S 17/36; G01S 17/42; G01S 17/46; G01S 17/48; G01S 17/50; G01S 17/58; G01S 17/66; G01S 17/74; G01S 17/86; G01S 17/87; G01S 17/875; G01S 17/88; G01S 17/89; G01S 17/894; G01S 17/90; G01S 17/93; G01S 17/931; G01S 17/933; G01S 17/95; H01S 5/18; G01C 3/00; G01C 3/02; G01C 3/04; G01C 3/06; G01C 3/08; G01C 3/085; G01C 3/10; G01C 3/12; G01C 3/14; G01C 3/16; G01C 3/18; G01C 3/20; G01C 3/22; G01C 3/24; G01C 3/26; G01C 3/28; G01C 3/30; G01C 3/32; G02B 5/30; G02B 5/3008; G02B 5/3025; G02B 5/3033; G02B 5/3041; G02B 5/305; G02B 5/3058; G02B 5/3066; G02B 5/3075; G02B 5/3083; G02B 5/3092
See application file for complete search history.

(56) References Cited

U.S. PATENT DOCUMENTS

| | | | |
|---|---|---|---|
| 5,345,304 A * | 9/1994 | Allen | G01S 7/4802 356/5.01 |
| 5,381,236 A * | 1/1995 | Morgan | G01B 11/026 250/201.7 |
| 9,013,544 B2 * | 4/2015 | Satoh | G03B 37/04 348/36 |
| 9,255,790 B2 * | 2/2016 | Zhu | G01B 11/24 |
| 10,088,557 B2 * | 10/2018 | Yeun | G01S 17/89 |
| 10,764,487 B2 * | 9/2020 | Kobayashi | G01S 17/89 |
| 10,788,574 B2 * | 9/2020 | Shim | G01S 17/42 |
| 10,884,130 B1 * | 1/2021 | Viswanatha | G01S 17/42 |
| 11,009,605 B2 * | 5/2021 | Li | G01S 17/10 |
| 2001/0055482 A1 * | 12/2001 | Braun | F21S 41/141 396/89 |
| 2006/0227316 A1 * | 10/2006 | Gatt | G01S 7/4811 356/5.09 |
| 2014/0036241 A1 | 2/2014 | Nishimori et al. | |
| 2014/0071408 A1 | 3/2014 | Takahashi et al. | |
| 2015/0042963 A1 | 2/2015 | Nishimori et al. | |
| 2015/0130932 A1 * | 5/2015 | Vredenborg | G01B 11/22 348/140 |
| 2015/0253653 A1 | 9/2015 | Fujita et al. | |
| 2015/0268346 A1 * | 9/2015 | Nakamura | G01S 7/487 356/5.04 |
| 2015/0316840 A1 | 11/2015 | Maeda et al. | |
| 2015/0373321 A1 * | 12/2015 | Bridges | G01S 17/48 348/46 |
| 2016/0223892 A1 | 8/2016 | Takahashi et al. | |
| 2016/0349606 A1 | 12/2016 | Nishimori et al. | |
| 2016/0377969 A1 | 12/2016 | Nishimori et al. | |
| 2017/0314917 A1 * | 11/2017 | Murata | G02B 13/18 |
| 2018/0120545 A1 * | 5/2018 | Aihara | G01C 11/06 |
| 2018/0310860 A1 * | 11/2018 | Kishima | G01B 11/026 |
| 2019/0113622 A1 * | 4/2019 | Wu | G02B 27/30 |
| 2020/0103508 A1 * | 4/2020 | Wang | G01S 7/4865 |
| 2020/0150238 A1 * | 5/2020 | Smith | G01S 17/10 |
| 2020/0284883 A1 * | 9/2020 | Ferreira | G01S 7/4816 |
| 2021/0116562 A1 * | 4/2021 | Heinonen | G01S 7/4915 |

FOREIGN PATENT DOCUMENTS

| | | | |
|---|---|---|---|
| JP | 2018-152632 | 9/2018 | |
| WO | WO-2014162991 A1 * | 10/2014 | G01S 17/10 |

* cited by examiner

OPTICAL APPARATUS AND DISTANCE MEASURING SYSTEM

CROSS-REFERENCE TO RELATED APPLICATIONS

This patent application is based on and claims priority pursuant to 35 U.S.C. § 119(a) to Japanese Patent Application No. 2019-052021, filed on Mar. 19, 2019, in the Japan Patent Office, the entire disclosure of which is hereby incorporated by reference herein.

BACKGROUND

Technical Field

The present disclosure relates to an optical apparatus and a distance measuring system.

Description of the Related Art

A distance measuring apparatus that measures the distance to an object (measurement target) present in a field-of-view area of a wide angle is known in the related art. Such a distance measuring apparatus includes a phototransmitter including a light source and an optical scanning mechanism, such as a rotating mirror, and a photoreceiver including a condenser lens, a light receiving element, and so on. Light beams emitted from the light source are deflected by the optical scanning mechanism and scanned over the field-of-view area as reference light. The distance measuring apparatus detects the distance to the measurement target on the basis of the time taken by the reference light to be reflected at the measurement target in the field-of-view area and received by the light receiving element.

A Time-of-Flight (ToF) camera that includes a distance measuring apparatus as described above to measure the distance to a measurement target on a per pixel basis is also known. With such a ToF camera, the distances to a plurality of measurement points of the measurement target can be simultaneously obtained, and distance information about the field-of-view area at a predetermined angle can be obtained in real time.

Further, a distance measuring apparatus is disclosed that detects a nearby object in a field of view that extends in all horizontal directions and measures the distance to and angle (azimuth) of the detected nearby object to measure the distance to the measurement object.

However, distance measuring apparatuses in the related art obtain information for each deflection angle of the optical scanning mechanism, which takes a certain time. Accordingly, it takes a considerable time to obtain distance information about the entire area of a wide field of view, such as a hemispherical area.

SUMMARY

Example embodiments include an optical apparatus including: a light source to emit reference light; a phototransmitter optical system to project the reference light emitted from the light source onto a measurement area extending 90 degrees or more; an image sensor having an imaging surface on which an optical image is formed; and a photoreceiver optical system to form an image of reflected light on the imaging surface, the reflected light being resulting from the reference light reflected at a measurement target present in the measurement area extending 90 degrees or more. The phototransmitter optical system and the photoreceiver optical system are disposed such that at least an optical axis of the phototransmitter optical system and an optical axis of the photoreceiver optical system partially coincide with each other, and at least a portion of the phototransmitter optical system and a portion of the photoreceiver optical system constitute a common optical system unit.

Example embodiments include a distance measuring system, which may be implemented by any number of apparatuses, including the optical apparatus.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, a distance measuring system according to embodiments will be described with reference to the attached drawings.

Overview

In the distance measuring system according to embodiments, a wide-angle lens, such as a group of fisheye lenses, having an angle of view of, for example, 90 degrees or more is used in a phototransmitter optical system that emits reference light and in a photoreceiver optical system that receives reflected light resulting from the reference light reflected at a measurement target. Further, at least some of the optical components in the phototransmitter optical system and in the photoreceiver optical system are used in common. Accordingly, information about distances to all measurement targets present in a detection area that extends, for example, over a hemisphere can be obtained in a short time (substantially simultaneously). Further, a movable part, such as a scanning mechanism, is not used, and therefore, the space where the optical components are placed can be reduced, resulting in a small and simple configuration.

First Embodiment

System Configuration

Figure 1:
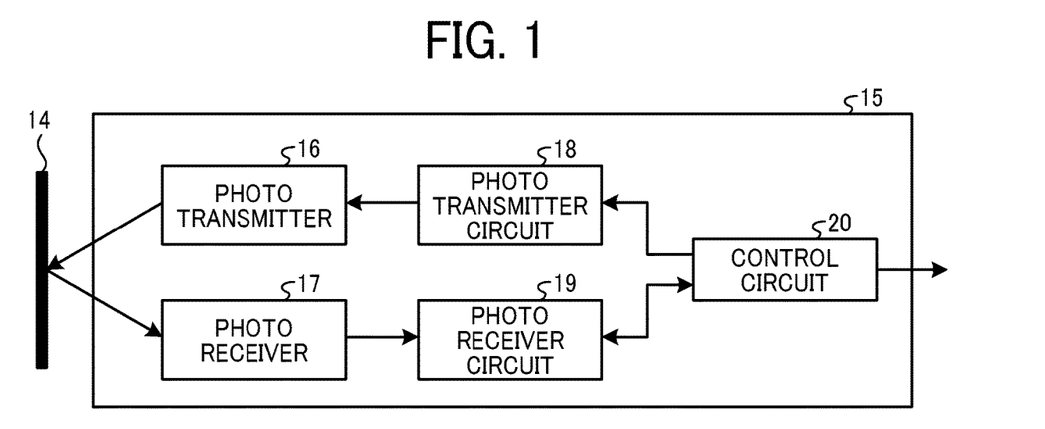
FIG. 1 is a diagram illustrating a system configuration of a distance measuring system according to a first embodiment.

FIG. 1 illustrates a system configuration of a distance measuring system 15 according to a first embodiment. As illustrated in FIG. 1, the distance measuring system 15 includes a phototransmitter 16, a photoreceiver 17, a phototransmitter circuit 18, a photoreceiver circuit 19, and a control circuit 20. The phototransmitter 16 includes a light source device 1a, which will be described with reference to FIG. 2. The light source device 1a includes a surface emitting laser 12a (an example of a light source), which is connected to the phototransmitter circuit 18. The phototransmitter circuit 18 is connected to the control circuit 20, which centrally controls the distance measuring system 15. Note that the distance measuring system may be formed of one or more apparatuses and may be referred to as a distance measuring apparatus.

The phototransmitter 16, which is an example of the phototransmitter optical system, and the photoreceiver 17, which is an example of the photoreceiver optical system, are disposed such that at least the optical axes thereof partially coincide with each other, and at least portions thereof constitute a common optical system that is used in common as described below. The common optical system is referred to as an optical system unit.

The phototransmitter circuit 18 supplies a driving signal to the surface emitting laser 12a on the basis of a control signal from the control circuit 20. The surface emitting laser 12a emits pulsed light on the basis of the driving signal supplied from the phototransmitter circuit 18. Accordingly, a detection area is formed around the distance measuring system 15.

The photoreceiver 17 includes a ToF sensor 10, which will be described with reference to FIG. 2. The ToF sensor 10 is an example of an image sensor and is connected to the photoreceiver circuit 19. The photoreceiver circuit 19 is connected to the control circuit 20. The photoreceiver circuit 19 outputs to the control circuit 20 a received-light signal that corresponds to the time point when reflected light from a measurement target 14 to the ToF sensor 10 is received. On the basis of the received-light signal, the control circuit 20 derives the time from when light (pulsed light) is emitted from the surface emitting laser 12a to when the light is received by each light receiving element of the ToF sensor 10, that is, the time taken by the light emitted from the surface emitting laser 12a to travel to and return from the measurement target 14. On the basis of the derived time, the control circuit 20 calculates and outputs distance data (measurement result) that indicates the distance to the measurement target 14.

Optical Configuration of Distance Measuring System

Figure 2:
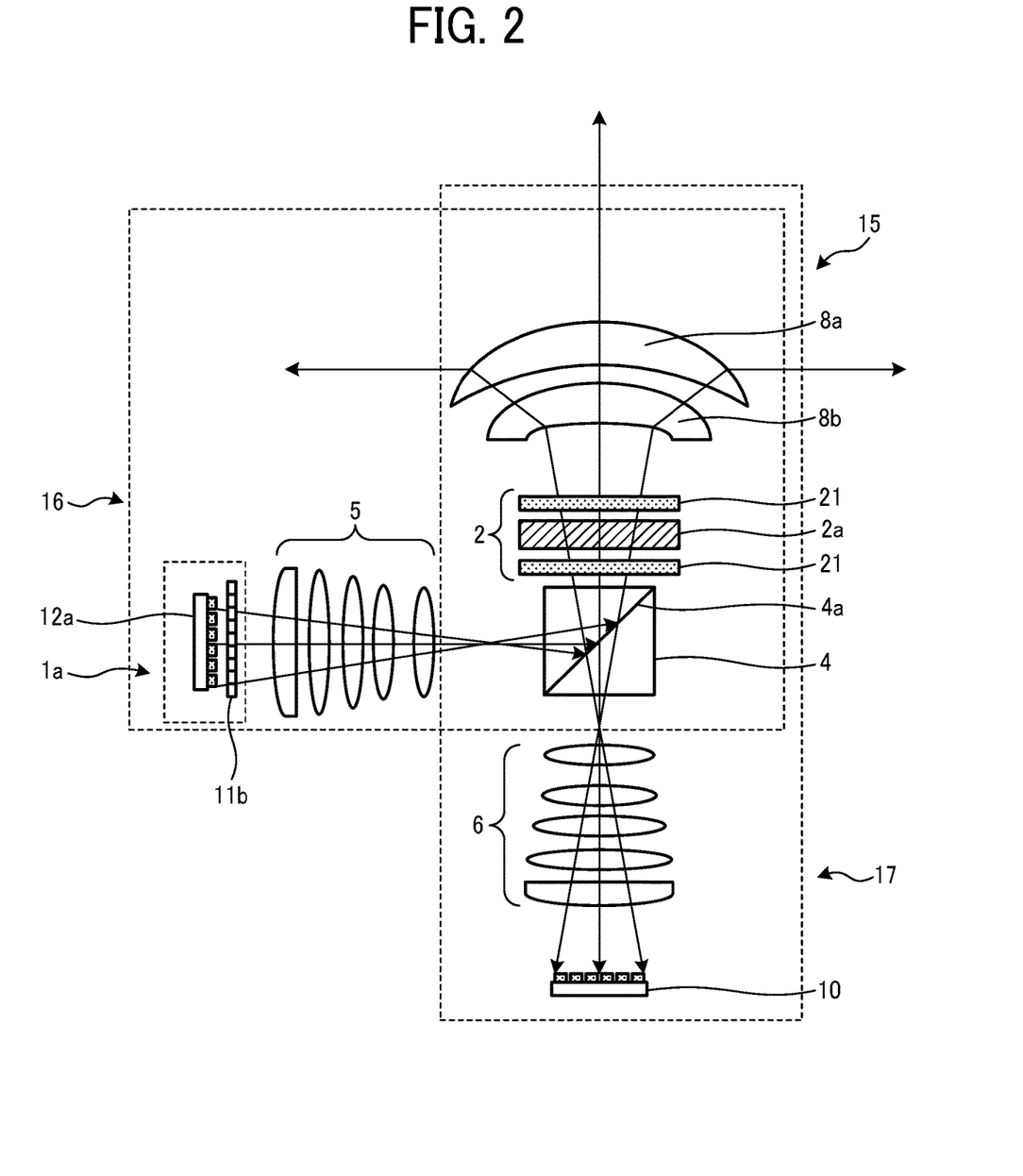
FIG. 2 is a diagram illustrating an optical configuration of the distance measuring system according to the first embodiment.

FIG. 2 is a diagram illustrating an optical configuration of the distance measuring system 15 according to the first embodiment. In FIG. 2, the light source device 1a includes the surface emitting laser 12a, which functions as a light source, and a microlens array 11b. The surface emitting laser 12a is a light emitting element formed of a plurality of light emitters arranged in two dimensions. For convenience of description, it is assumed that, for example, light beams emitted from the surface emitting laser 12a have a polarization property of the S-wave (S-polarized wave), and the surface emitting laser 12a is an example of a laser light source having a single polarization property.

The microlens array 11b is a lens array formed of a plurality of lenses arranged in two dimensions and is provided so as to correspond to the light emitters of the surface emitting laser 12a. Laser light from the surface emitting laser 12a is shaped into predetermined light beams by the microlens array 11b and guided to a phototransmitter optical system 5. The phototransmitter optical system 5 focuses and guides the laser beams to a polarization beam splitter 4.

As described above, the light source device 1a includes the surface emitting laser 12a and the microlens array 11b. However, an edge emitting laser diode or a light emitting diode (LED) and a coupling lens may be used.

Light is an electromagnetic wave and propagates while the electric field and magnetic field thereof oscillate perpendicular to the direction of travel. Light, with the electric field oscillating perpendicular to the plane of incidence in the direction of travel, is called the S-wave (S-polarized light), and light, with the electric field oscillating parallel to the plane of incidence, is called the P-wave (P-polarized light). The polarization beam splitter 4 includes a polarization separating film 4a (polarization separator), and reflects light beams of incident S-waves (S-polarized light) and transmits light beams of P-waves (P-polarized light). The light beams reflected at the polarization beam splitter 4 are guided to a first polarization converter 2. The first polarization converter 2 is formed of a first polarization converter element 2a and two quarter-wave plates 21.

Functions of Phototransmitter

Figure 3A:
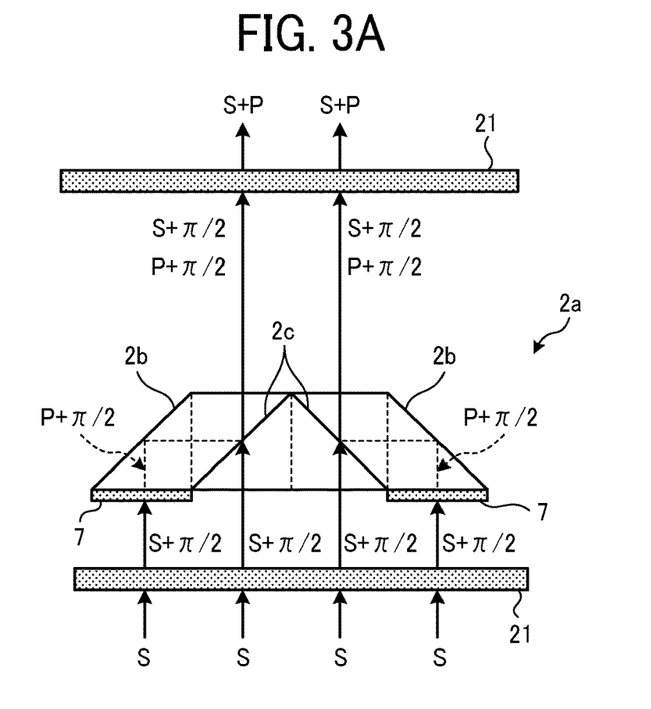
FIGS. 3A and 3B are schematic diagrams illustrating operations in a case where a first polarization converter functions as a phototransmitter in the distance measuring system according to the first embodiment.

FIG. 3A is a schematic diagram for explaining the functions of the first polarization converter 2 that functions as the phototransmitter 16. As illustrated in FIG. 3A, S-waves (S-polarized waves) guided to the quarter-wave plate 21 are converted to circularly polarized components to which a phase difference of $\pi/2$ ($=\lambda/4$) has been added in the electric-field oscillating direction (plane of polarization) of the incident light, and thereafter, are incident on the first polarization converter element 2a.

The first polarization converter element 2a is formed by, for example, joining triangular prisms, and a circular polarization reflecting film 2b and a circular polarization separating film 2c are vapor-deposited on the inclined surfaces thereof. The light beams of the circularly polarized components in the polarization direction of S+π/2 incident on the circular polarization separating film 2c transmit the circular polarization separating film 2c as is.

Here, the circular polarization separating film 2c is formed of a film that transmits light beams of circularly polarized components in the polarization direction of S+π/2 and that reflects light beams of circularly polarized components in the polarization direction of P+π/2. In other words, the circular polarization separating film 2c has a function of transmitting light beams of right-circularly polarized components and reflecting light beams of left-circularly polarized components. The circular polarization separating film 2c has a function of not changing the orientation of polarization (not rotating the orientation) when reflecting light beams of circularly polarized components in the polarization direction of P+π/2.

In the above-described example, the circular polarization separating film 2c has a function of not changing the orientation of polarization (not rotating the orientation) when reflecting light beams of circularly polarized components in the polarization direction of P+π/2. However, in a case where the circular polarization separating film 2c does not have such a function and the light beams are sent with the polarization direction of P+π/2 rotated, an optical configuration may be employed in which the light beams of P+π/2 sent from the circular polarization separating film 2c are reflected by a mirror once (or an odd number of times). Accordingly, the polarization direction of the light beams of P+π/2 sent from the circular polarization separating film 2c with the polarization direction rotated is restored to the original direction for use.

For the light beams that are not incident on the circular polarization separating film 2c, the angle of polarization is rotated by a half-wave plate 7 provided on an incidence portion of the first polarization converter element 2a by 90 degrees, and the light beams are converted to light beams of circularly polarized components in the polarization direction of P+π/2 (opposite to the polarization direction of S+π/2) and guided to the circular polarization reflecting film 2b. As described above, in a case where the incident light is a circularly polarized light beam, the polarization direction is reversed from right to left or from left to right after the incident light has passed through the half-wave plate 7.

The light beams of the circularly polarized components in the polarization direction of P+π/2 reflected at the circular polarization reflecting film 2b are reflected at the circular polarization separating film 2c and sent in a direction the same as the direction of the light beams of the circularly polarized component of S+π/2.

The circular polarization reflecting film 2b is formed of a film that does not change the orientation of polarization (does not rotate the orientation) when reflecting light beams of circularly polarized components of P+π/2. When circularly polarized light beams are reflected by a usual mirror or the like, the polarization direction is reversed such that, for example, left rotation is changed to right rotation, and the light beams pass through the circular polarization separating film 2c in the subsequent stage, resulting in inconvenience. Accordingly, as the circular polarization reflecting film 2b, a film that does not change the polarization direction of circularly polarized light beams is used.

Figure 3B:
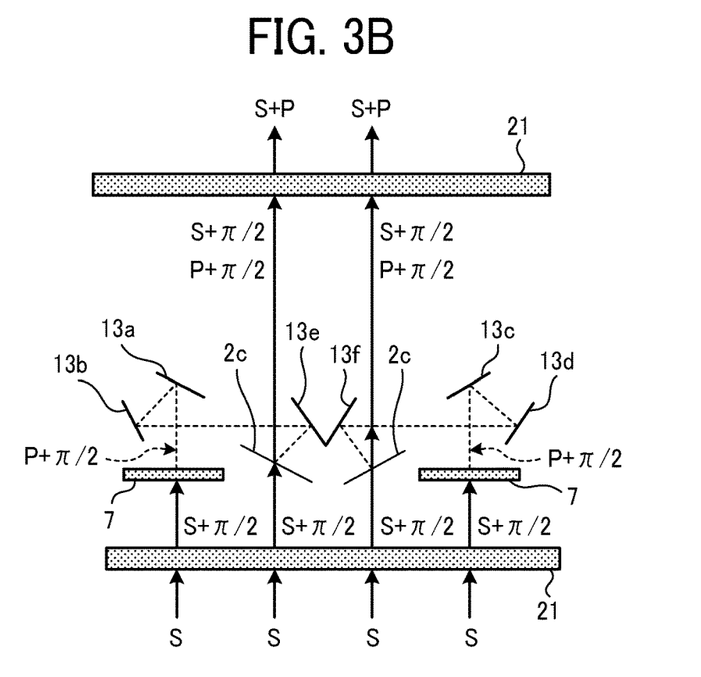

Alternatively, as illustrated in FIG. 3B, instead of the circular polarization reflecting film 2b, a pair of two reflecting mirrors 13a and 13b and two reflecting mirrors 13c and 13d are provided. Further, a reflecting mirror 13e that further reflects light beams reflected at the reflecting mirrors 13a and 13b and a reflecting mirror 13f that further reflects light beams reflected at the reflecting mirrors 13c and 13d are provided.

A light beam of a circularly polarized component of P+π/2 from the half-wave plate 7 is reflected two times, that is, at the reflecting mirrors 13a and 13b, and a light beam of a circularly polarized component of P+π/2 from the half-wave plate 7 is reflected two times, that is, at the reflecting mirrors 13c and 13d. Each of these reflected light beams is further reflected at a corresponding one of the reflecting mirror 13e and the reflecting mirror 13f and guided to the circular polarization separating film 2c. Accordingly, when the light beams of the circularly polarized components in the polarization direction of P+π/2 are reflected at the circular polarization separating film 2c, the orientation of the polarization can be left unchanged (is not rotated).

When the light beams of the circularly polarized components of S+π/2 and the light beams of the circularly polarized components in the polarization direction of P+π/2 sent from the first polarization converter element 2a pass through the quarter-wave plate 21 again, the light beams are sent as randomly polarized light beams (S-polarized light+P-polarized light) and guided to a group of fisheye lenses 8a and 8b, which is an example of the wide-angle lens having an angle of view of 90 degrees or more. For example, the group of fisheye lenses 8a and 8b has an angle of view of 180 degrees. The group of fisheye lenses 8a and 8b projects the incident light beams onto a detection area that extends over a hemisphere as reference light to form the detection area for the measurement target 14. The randomly polarized light beams (S-polarized light+P-polarized light) reflected at the measurement target 14 in the detection area pass through the group of fisheye lenses 8a and 8b again and are guided to the first polarization converter 2.

Functions of Photoreceiver

Figure 4:
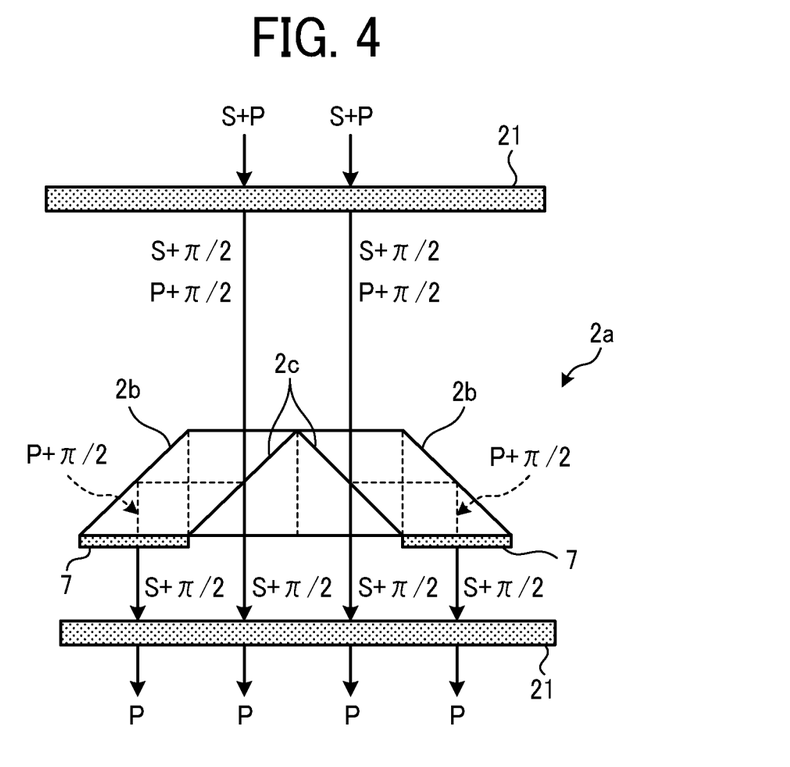
FIG. 4 is a schematic diagram illustrating operations in a case where the first polarization converter functions as a photoreceiver in the distance measuring system according to the first embodiment.

FIG. 4 is a schematic diagram for explaining the functions of the first polarization converter 2 that functions as the photoreceiver 17. Randomly polarized light beams (S-polarized light+P-polarized light) guided to the first polarization converter 2 pass through the quarter-wave plate 21 and are incident on the first polarization converter element 2a with a phase difference of π/2 added on the plane of polarization (S+π/2, P+π/2).

The light beams in the polarization direction of circularly polarized components of S+π/2 incident on the circular polarization separating film 2c pass through the circular polarization separating film 2c as is. On the other hand, the light beams in the polarization direction of circularly polarized components of P+π/2 are reflected at the circular polarization separating film 2c. Then, the light beams of the circularly polarized components of P+π/2 are reflected at the circular polarization reflecting film 2b and sent in a direction substantially the same as the direction of the light beams of the circularly polarized components of S+π/2.

As described above, the circular polarization reflecting film 2b is formed of a film that does not change the polarization direction of circular polarization (does not rotate the polarization direction) when reflecting light beams of circularly polarized components of P+π/2. Further, the circular polarization separating film 2c is formed of a film that transmits light beams in a direction in which circular polarization of S+π/2 rotates and that reflects light beams in a direction in which circular polarization of P+π/2 rotates (that is, has a function of transmitting light beams of right-circularly polarized components and reflecting light beams of left-circularly polarized components).

Accordingly, when light beams of circularly polarized components of P+π/2 reflected at the circular polarization reflecting film 2b pass through the half-wave plate 7 provided on an exit portion of the first polarization converter element 2a, the angle of polarization is rotated by 90 degrees, and the light beams are converted to light beams of circularly polarized components of S+π/2 and sent. When the light beams of the circularly polarized components of S+π/2 pass through the quarter-wave plate 21 again, the light beams are converted to light beams of P-polarized components and sent toward the polarization beam splitter 4. The P-waves (P-polarized waves) pass through the polarization beam splitter 4, are condensed by a photoreceiver optical system 6, and thereafter, are guided to the ToF sensor 10.

As is apparent from the above description, in the distance measuring system of the first embodiment, some of the optical components that constitute the phototransmitter 16 and the photoreceiver 17 are formed on the same optical axis and used in common, which can reduce the space where the optical components are placed, resulting in a reduced system size.

In particular, the group of fisheye lenses 8a and 8b is large in size among the optical components in use. When the group of fisheye lenses 8a and 8b is used in common, the space for placement can be significantly reduced. Further, when the optical components are used in common, the number of optical components and auxiliary components can be reduced, resulting in a reduced system cost. Further, the workload for assembly can be reduced, resulting in increased productivity.

Further, all measurement targets 14 that are present in the detection area that extends over a hemisphere can be detected, and the distances to the detected measurement targets 14 can be measured at once without a movable part, such as a scanning mechanism. Accordingly, no optical scanner needs to be driven by a motor via a rotor, no noise associated with rotation of the motor is produced, and there is no need for apprehension for the reliability of the movable part. Distance information about the entire area of a wide field of view, such as a hemispherical area, can be obtained with integrated optical systems. Therefore, inconvenience where reference light of one of the optical systems affects the other optical system can be prevented, and highly stable and accurate distance information can be obtained.

Second Embodiment

Figure 5:
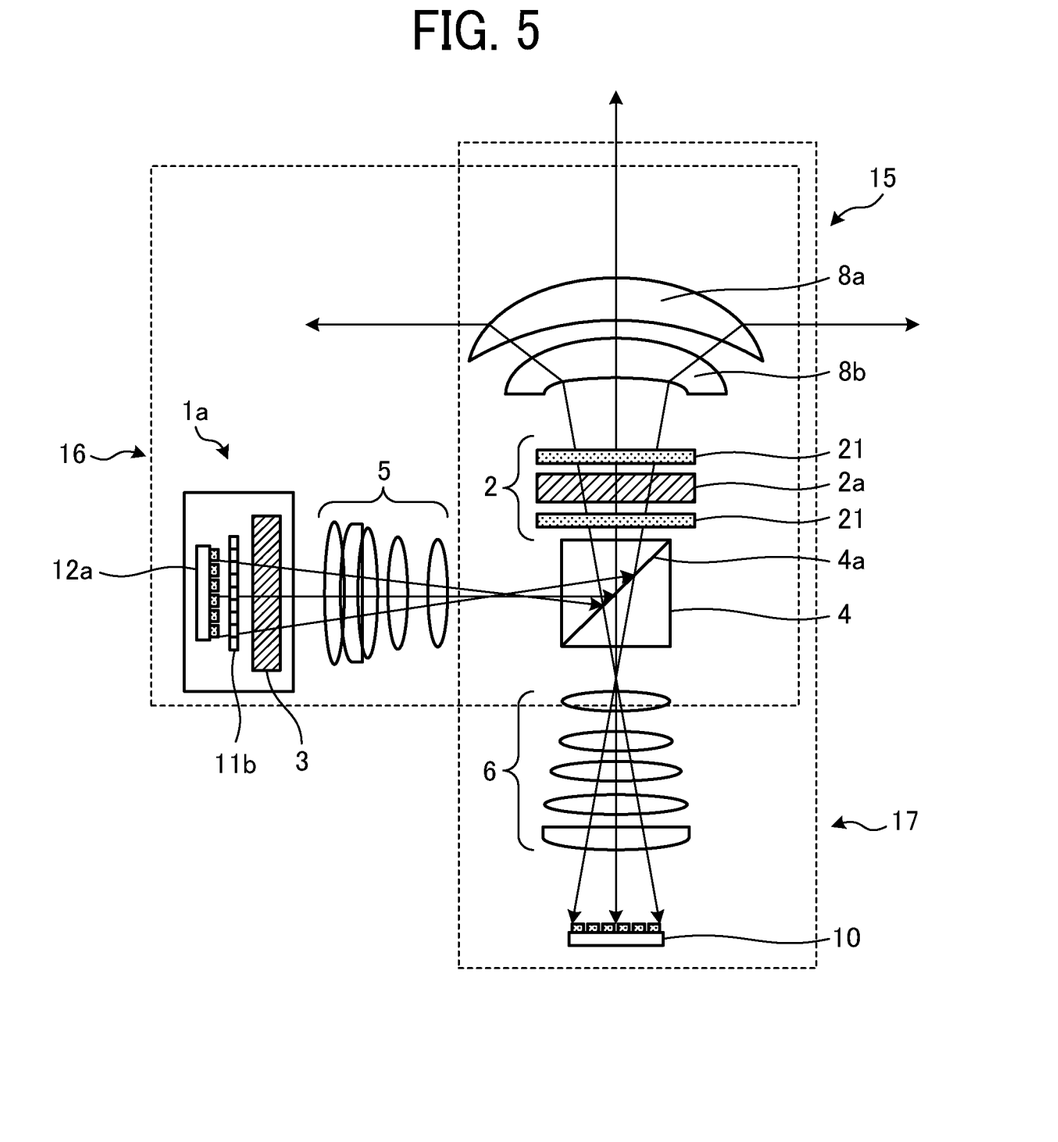
FIG. 5 is a diagram illustrating an optical configuration of a distance measuring system according to a second embodiment.

Next, a distance measuring system according to a second embodiment will be described. The distance measuring system according to the second embodiment includes, for example, a second polarization converter 3 provided between the microlens array 11b and the phototransmitter optical system 5. This is the difference between the first embodiment described above and the second embodiment described below. The difference between the embodiments will be described below, and duplicated descriptions will be omitted.

FIG. 5 is a diagram illustrating an optical configuration of the distance measuring system 15 according to the second embodiment. In this case of the second embodiment, the light source device 1a includes the surface emitting laser 12a, the microlens array 11b, and the second polarization converter 3. The surface emitting laser 12a emits randomly polarized light beams (S-waves and P-waves) in which a plurality of polarization properties are mixed.

Figure 6:
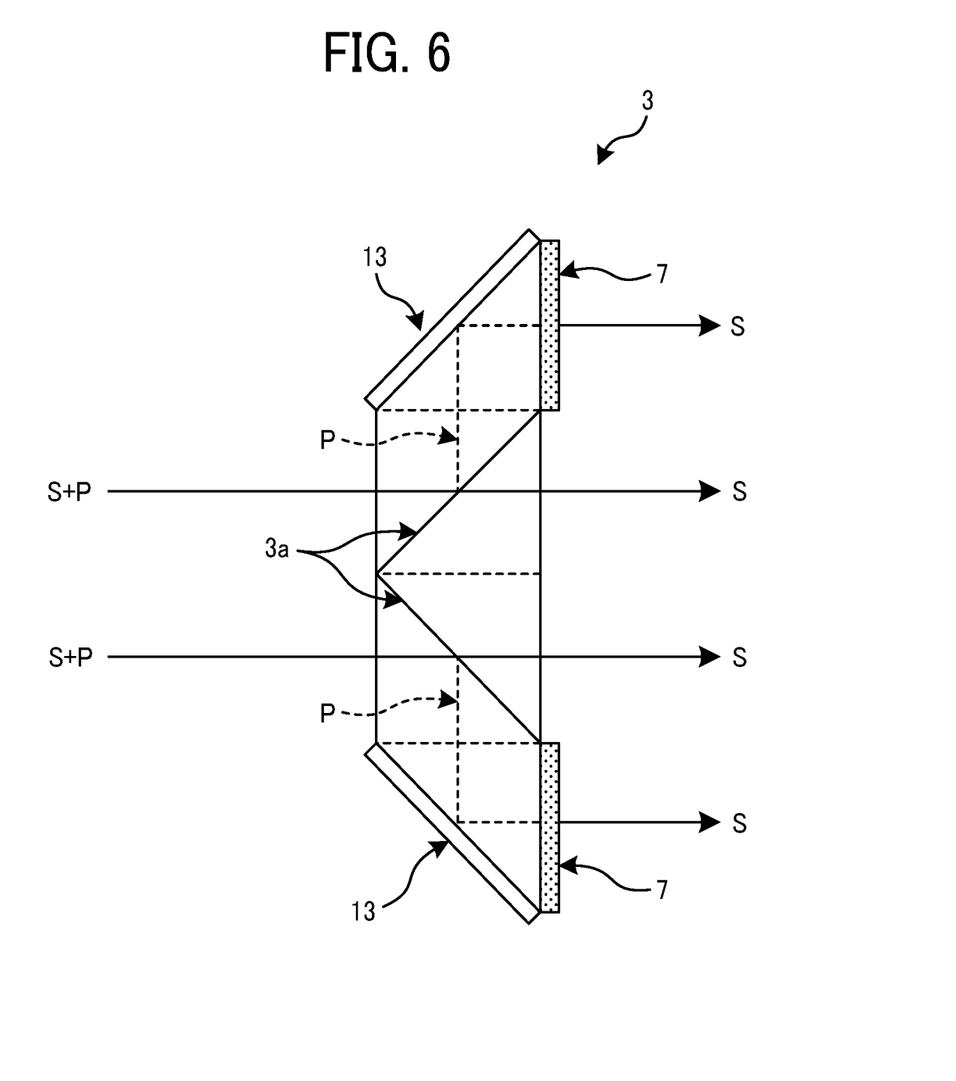
FIG. 6 is a schematic diagram for explaining the functions of a second polarization converter in the distance measuring system according to the second embodiment.

FIG. 6 is a schematic diagram for explaining the functions of the second polarization converter 3. As illustrated in FIG. 6, randomly polarized light (S-waves+P-waves) emitted from the surface emitting laser 12a, which is an example of a laser light source in which a plurality of polarization properties are mixed, is shaped by the microlens array 11b into desired light beams, and thereafter, the light beams are incident on the second polarization converter 3. The second polarization converter 3 is formed by joining triangular prisms, has an inclined surface on which a polarization separating film (polarization beam splitter (PBS) film) 3a is vapor-deposited, and transmits light beams of S-wave (S-polarized wave) components incident on the polarization separating film 3a as is. The second polarization converter 3 reflects light beams of P-wave (P-polarized wave) components incident on the polarization separating film 3a at the polarization separating film 3a.

The light beams of the P-wave (P-polarized wave) components reflected at the polarization separating film 3a are reflected at a mirror 13 and pass through the half-wave plate 7 provided on an exit portion of the second polarization converter 3. At this time, the angle of polarization of the light beams of the P-wave (P-polarized wave) components is rotated by the half-wave plate 7 by 90 degrees, the light beams are converted to light beams of S-polarized components, and the converted light beams are incident on the phototransmitter optical system 5. Accordingly, laser light of randomly polarized components (S-waves+P-waves) can be consistently converted to light beams of S-polarized components, and the converted light beams can be incident on the phototransmitter optical system 5. Then, as described above, the phototransmitter optical system 5 focuses and guides the laser beams to the polarization beam splitter 4 as in the first embodiment.

In the case of the distance measuring system 15 according to the second embodiment described above, even if the surface emitting laser 12a is a laser light source of randomly polarized light (in which S-waves and P-waves are mixed), the laser light can be consistently converted to light beams of desired polarized components by the second polarization converter 3, and the converted light beams can be incident on the phototransmitter optical system 5. Accordingly, as the surface emitting laser 12a, a low-cost one that emits laser light of inconsistent polarized components can be used, resulting in low-cost manufacturing of the distance measuring system 15.

Third Embodiment

Figure 7:
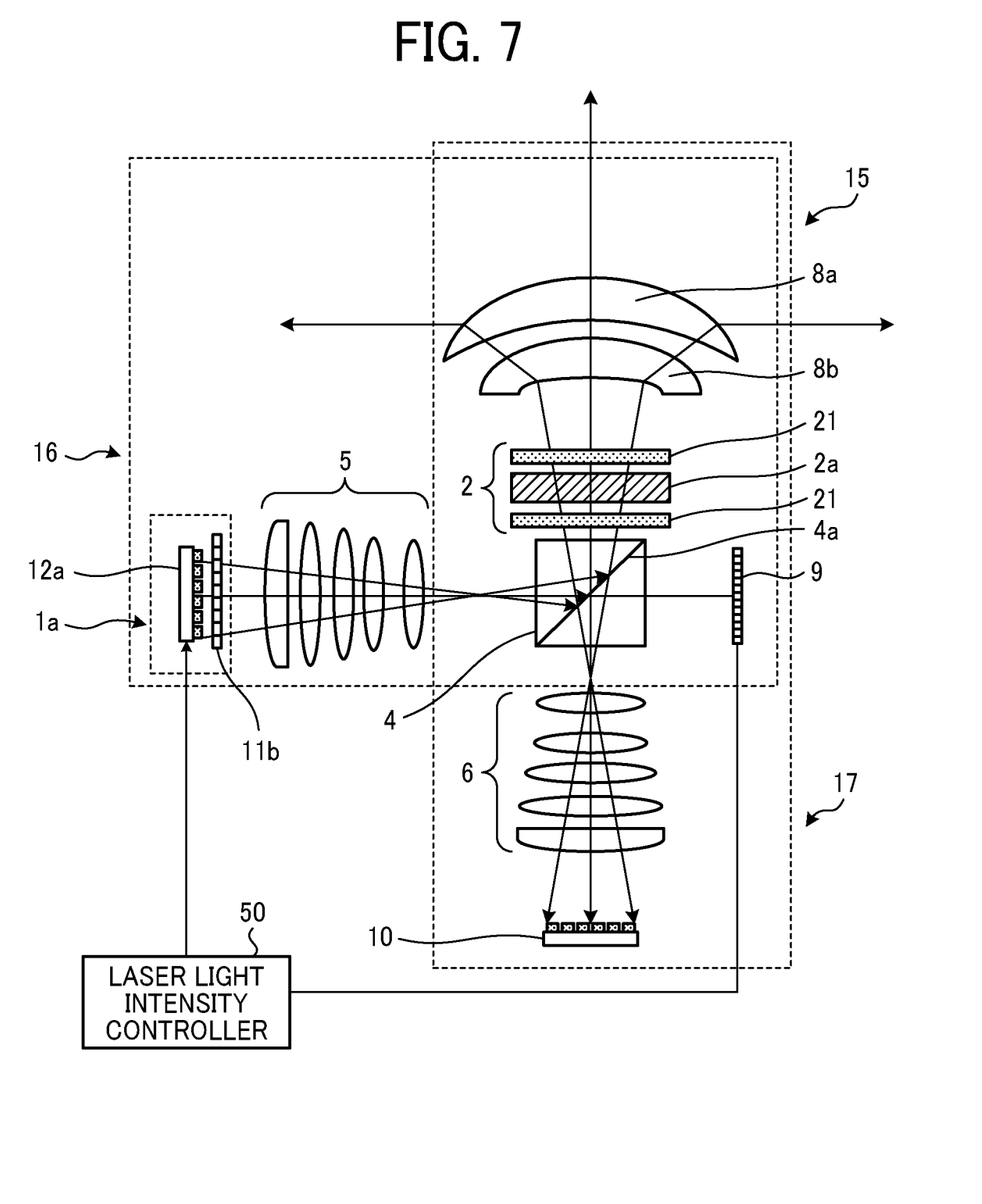
FIG. 7 is a diagram illustrating a configuration of part of a distance measuring system according to a third embodiment.

Next, a distance measuring system according to a third embodiment will be described. The distance measuring system according to the third embodiment includes, for example, a sensor for sensing the intensity of laser light, and a laser light source, such as the surface emitting laser 12a, is controlled on the basis of the sensed intensity of laser light so as to constantly emit laser light having a specific intensity. This is the difference between the above-described embodiments and the third embodiment described below. Therefore, the difference will be described below, and duplicated descriptions will be omitted.

FIG. 7 is a diagram illustrating an optical configuration of the distance measuring system 15 according to the third embodiment. In this case of the third embodiment, a photosensor 9 is provided such that the optical axis thereof coincides with the optical axis of the surface emitting laser 12a, the microlens array 11b, the phototransmitter optical system 5, and the polarization beam splitter 4. In the case of the third embodiment, a laser light intensity controller 50 (an example of a controller) that controls the surface emitting laser 12*a* on the basis of the intensity of laser light sensed by the photosensor 9 so as to constantly emit a specific level of laser light is provided.

As described above, light beams of S-polarized components emitted from the light source device 1*a* are incident on the polarization beam splitter 4, reflected at the polarization separating film 4*a*, and sent to the first polarization converter 2. Here, the reflectance of the polarization separating film 4*a* is, for example, about 97%. Therefore, several percent of the light beams of the S-polarized components incident on the polarization beam splitter 4 from the light source device 1*a* transmit the polarization beam splitter 4 and are incident on the photosensor 9. The photosensor 9 detects the intensity of the several percent of the light beams of the S-polarized components and supplies the result of detection indicating the light intensity to the laser light intensity controller 50.

Figure 8:
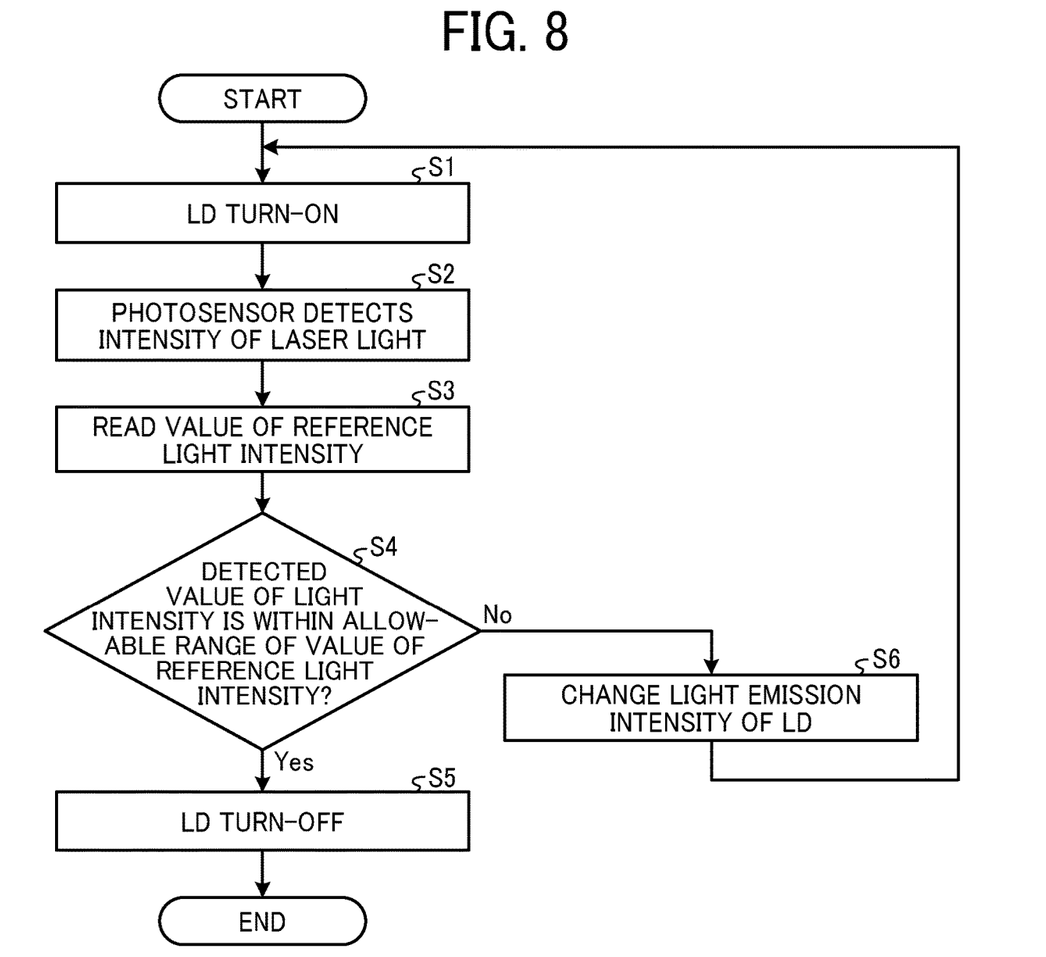
FIG. 8 is a flowchart illustrating a flow of feedback control by a laser light intensity controller in the distance measuring system according to the third embodiment.

The laser light intensity controller 50 controls the intensity of laser light emitted from the surface emitting laser 12*a* on the basis of the intensity of laser light detected by the photosensor 9 so as to constantly emit a specific intensity of laser light. The flowchart in FIG. 8 is a flowchart illustrating a flow of feedback control by the laser light intensity controller 50 described above. When a user turn on the main power supply, the laser light intensity controller 50 of the distance measuring system 15 transitions to a "laser light intensity regulating mode", and the steps in the flowchart in FIG. 8 are sequentially performed from step S1.

In step S1, the surface emitting laser 12*a* (laser diode (LD)) emits laser light having an intensity for a short time, the intensity being reduced to a certain degree so as not to be harmful to human bodies (LD turn-on). The photosensor 9 detects the intensity of the laser light and supplies the detected output to the laser light intensity controller 50 (step S2). The laser light intensity controller 50 monitors the detected output (which is the current intensity of the laser light) from the photosensor 9 with reference to a reference intensity of laser light (threshold) (step S3) and determines whether the current intensity of the laser light is within an allowable range relative to the reference light intensity (step S4). In a case where it is determined that the measured light intensity is outside the allowable range as a result of the comparison determination (No in step S4), the laser light intensity controller 50 controls the surface emitting laser 12*a* and regulates the intensity of the laser light so as to attain the appropriate reference light intensity (step S6).

On the other hand, in a case where it is determined that the measured light intensity is within the allowable range as a result of the comparison determination in step S4 (Yes in step S4), the flow proceeds to step S5, the laser light intensity controller 50 controls and turns the surface emitting laser 12*a* off, and the "laser light intensity regulating mode" ends.

With the distance measuring system 15 according to the third embodiment, the intensity of the light emitted from the surface emitting laser 12*a* can be detected. Accordingly, the amount of decrease in optical output associated with an increase in the temperature of the light source can be detected, and the intensity of the emitted light can be kept constant by feedback control for the light source. Consequently, stable distance measurement can be constantly performed. Further, abnormal light emission by the surface emitting laser 12*a* can be detected, resulting in increased safety. In addition, effects similar to those in the above-described embodiments can be attained.

In the example described in this embodiment, the photosensor 9 is provided to detect the intensity of laser light. However, temperature changes may be detected by using a temperature sensor, such as a thermistor, as long as the intensity of laser light can be detected. In this case, the thermistor senses a temperature corresponding to the current intensity of laser light, and the laser light intensity controller 50 controls the intensity of the laser light from the surface emitting laser 12*a* so that the temperature sensed by the thermistor is kept constant.

In the example described in this embodiment, a transition to the "laser light intensity regulating mode" occurs when the main power supply is turned on. However, the intensity of laser light may be measured in accordance with the use time of the surface emitting laser 12*a*, and control may be performed so as to keep the measured light intensity constant. Accordingly, aging of the surface emitting laser 12*a* can be corrected so that laser light having a specific intensity can be constantly emitted, and a stable distance measuring operation can be performed. Alternatively, the laser light intensity regulating operation in the "laser light intensity regulating mode" may be performed immediately before a measurement operation that is performed when the user performs distance measurement.

Fourth Embodiment

Figure 9:
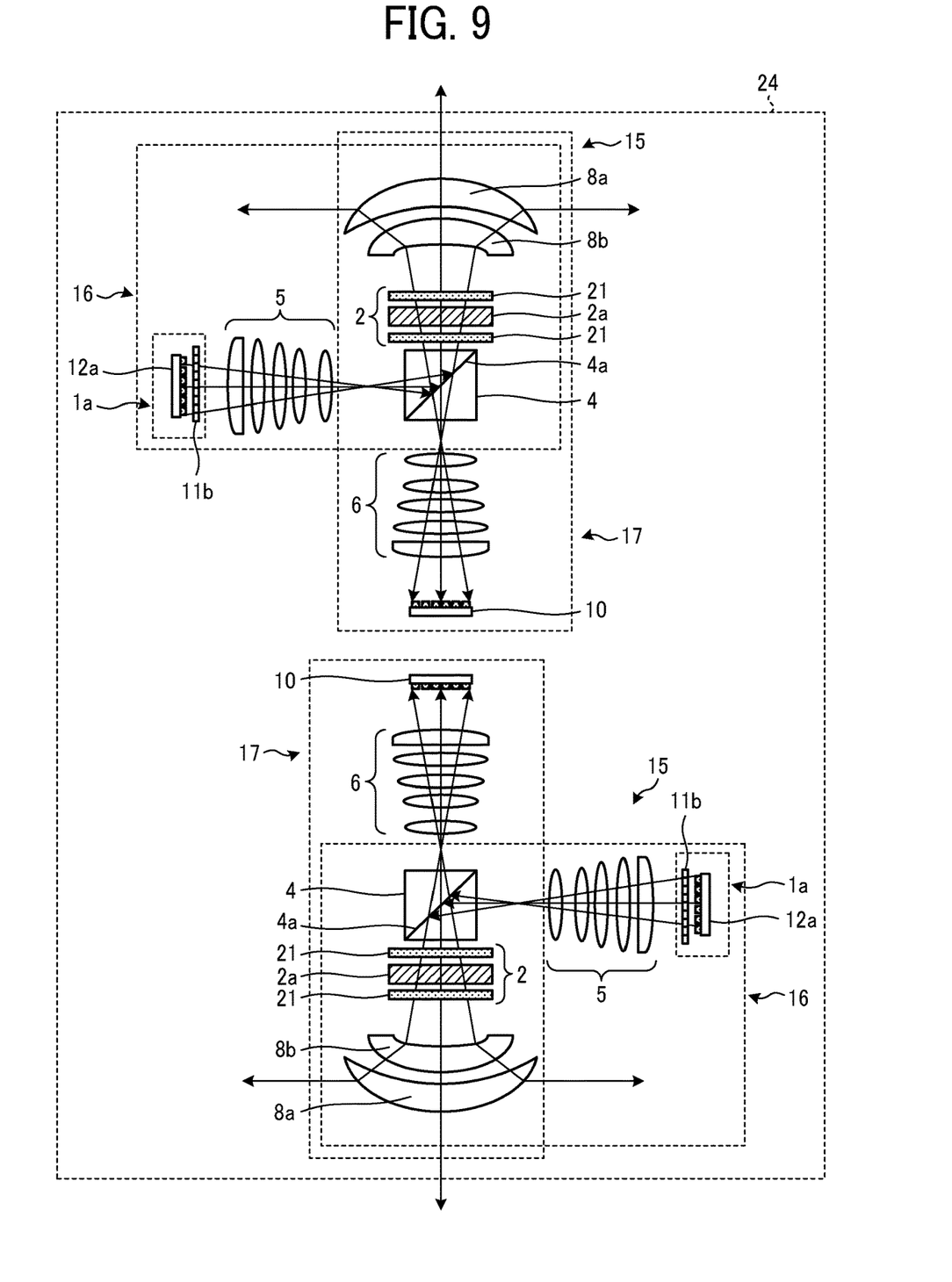
FIG. 9 is a diagram illustrating a configuration of part of a distance measuring system according to a fourth embodiment.

Next, a distance measuring system according to a fourth embodiment will be described. FIG. 9 is a diagram illustrating a configuration of part of the distance measuring system according to the fourth embodiment. As illustrated in FIG. 9, in the distance measuring system (distance measuring system 24) according to the fourth embodiment, for example, two distance measuring systems 15 are used and disposed opposite to each other such that the hemispherical (180-degree) measurement areas thereof are located outside to enable measurement of a spherical (360-degree) measurement area. With such a configuration, distances to objects in the spherical space (360-degree space) can be simultaneously measured with a simple configuration without a movable part, such as a scanning mechanism.

Fifth Embodiment

Figure 10:
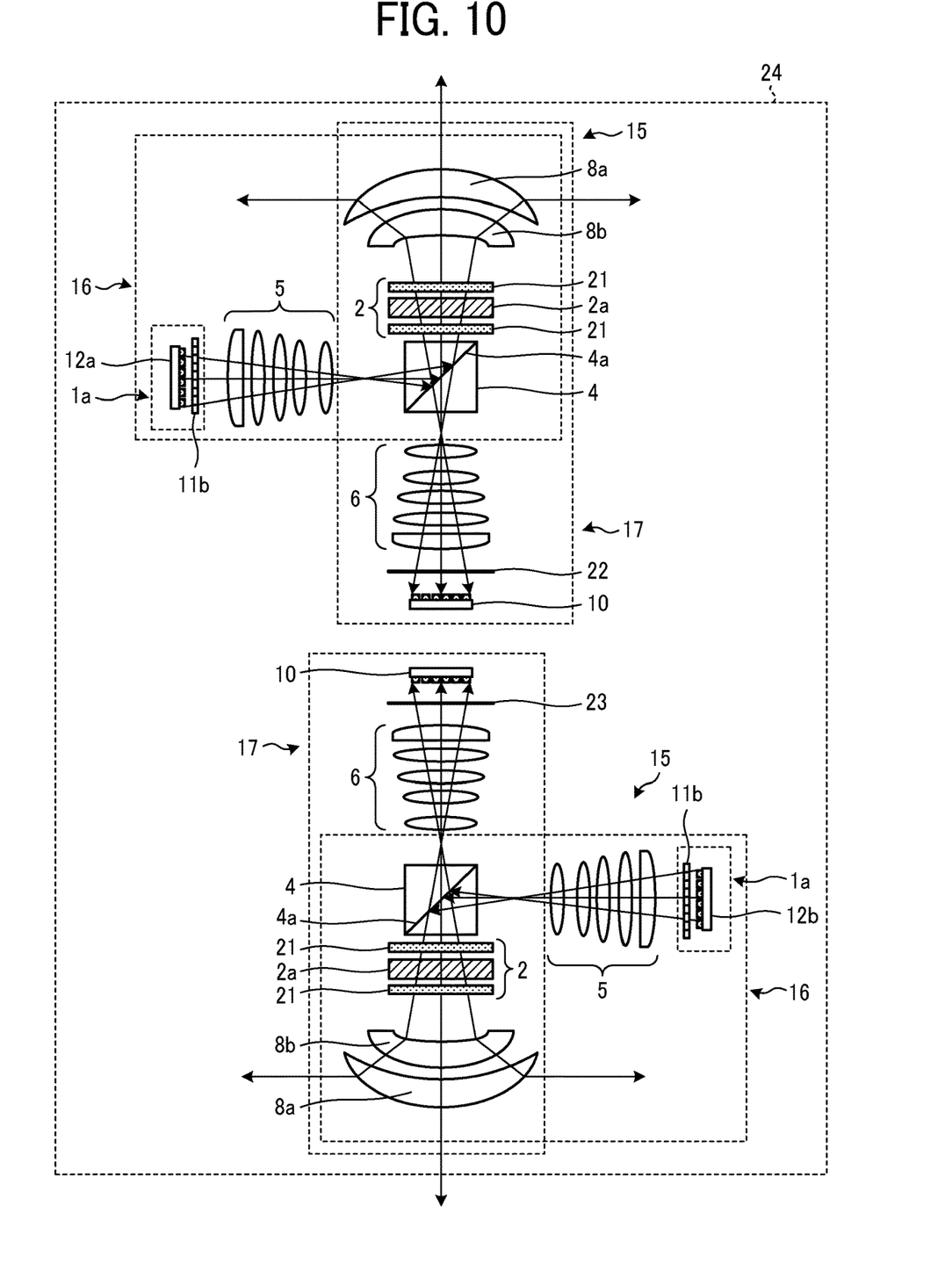
FIG. 10 is a diagram illustrating a configuration of part of a distance measuring system according to a fifth embodiment.

Next, a distance measuring system according to a fifth embodiment will be described. FIG. 10 is a diagram illustrating a configuration of part of the distance measuring system according to the fifth embodiment. The distance measuring system according to the fifth embodiment also employs the distance measuring system 24 that enables measurement of the spherical (360-degree) measurement area as in the distance measuring system according to the fourth embodiment. Differences from the above-described fourth embodiment will be described below.

In the distance measuring system 24, in one of the distance measuring systems 15, the surface emitting laser 12*a* that emits light in a range of wavelength a (a>b) is used, and a bandpass filter 22 that transmits laser light in a range higher than the range of wavelength a is disposed immediately before the ToF sensor 10.

In the distance measuring system 24, in the other distance measuring system 15, a surface emitting laser 12*b* that emits laser light in a range of wavelength b (a>b) is used, and a bandpass filter 23 that transmits laser light in a range lower than the range of wavelength b is disposed immediately before the ToF sensor 10.

Accordingly, even in the case where two distance measuring systems 15 are disposed opposite to each other and the distances to objects in the spherical space (360-degree space) are simultaneously measured, inconvenience where reference light emitted from one of the distance measuring systems 15 and reflected affects the ToF sensor 10 of the other distance measuring system 15 can be prevented, resulting in a further increase in measurement accuracy. Consequently, pieces of highly stable and accurate distance information can be simultaneously obtained in the spherical space (360-degree space).

As described in at least one of the above-described embodiments, it is possible to provide an optical apparatus and a distance measuring system with which even distance information about an area of a wide field of view can be obtained in a short time.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Any one of the above-described operations may be performed in various other ways, for example, in an order different from the one described above.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

The invention claimed is:

1. An optical apparatus comprising:
a light source configured to emit reference light;
a phototransmitter optical system configured to project the reference light emitted from the light source onto a measurement area extending 90 degrees or more;
an image sensor having an imaging surface on which an optical image is formed; and
a photoreceiver optical system configured to form an image of reflected light on the imaging surface, the reflected light being resulting from the reference light reflected at a measurement target present in the measurement area extending 90 degrees or more, wherein
the phototransmitter optical system and the photoreceiver optical system are disposed such that at least an optical axis of the phototransmitter optical system and an optical axis of the photoreceiver optical system partially coincide with each other, and at least a portion of the phototransmitter optical system and a portion of the photoreceiver optical system constitute a common optical system unit,
wherein the common optical system unit includes:
a polarization separator configured to reflect light having a polarization property emitted or sent from the light source and to transmit light having an opposite polarization property to the polarization property of the light emitted or sent from the light source; and
a first polarization converter configured to convert the light reflected at the polarization separator to light in which a plurality of polarization properties are mixed and send the converted light and to convert the light in which the plurality of polarization properties are mixed and which is reflected at the measurement target to light having the opposite polarization property to the polarization property of the light emitted or sent from the light source.

2. The optical apparatus according to claim 1, wherein the light source includes:
a laser light source in which a plurality of polarization properties are mixed; and
a second polarization converter configured to convert light that is emitted from the laser light source and in which the plurality of polarization properties are mixed to light having a single polarization property and send the converted light.

3. The optical apparatus according to claim 1, wherein the common optical system unit includes a fisheye lens having an angle of view of 180 degrees or more.

4. The optical apparatus according to claim 1, wherein the light source is a surface emitting laser.

5. The optical apparatus according to claim 1, further comprising:
a photosensor configured to detect a magnitude of an optical output from the light source; and
circuitry configured to control the light source based on the magnitude of the optical output detected by the photosensor so as to keep the optical output constant.

6. A distance measuring system comprising the optical apparatus according to claim 1.

7. The optical apparatus according to claim 1, wherein the light source is a laser light source having a single polarization property.

8. The optical apparatus according to claim 7, wherein
the first polarization converter includes a polarization reflecting film and a polarization separating film, and
the polarization reflecting film is a film configured not to rotate a polarization direction when reflecting a circularly polarized component, and the polarization separating film is formed of a film configured to transmit a light beam in a polarization direction of one circular polarization and reflect a light beam in a polarization direction of another circular polarization.

9. An optical apparatus comprising
two optical apparatuses each of which is the optical apparatus according to claim 1, wherein
the optical apparatuses are disposed such that non-measurement surfaces of the respective optical apparatuses face each other, and are configured to project light onto measurement areas of the respective optical apparatuses and receive reflected light to measure a distance to a measurement target present in the measurement areas.

10. The optical apparatus according to claim 9, wherein the light source of one of the optical apparatuses is configured to emit light having a wavelength different from a wavelength of light emitted from the light source of another one of the optical apparatuses, and the image sensor of each optical apparatus is configured to receive light having the wavelength of the light emitted from the light source of the optical apparatus.

* * * * *